United States Patent
Kohda et al.

(10) Patent No.: US 9,450,176 B2
(45) Date of Patent: Sep. 20, 2016

(54) RECTIFYING DEVICE, TRANSISTOR, AND RECTIFYING METHOD

(75) Inventors: Makoto Kohda, Miyagi (JP); Junsaku Nitta, Miyagi (JP); Kensuke Kobayashi, Kyoto (JP)

(73) Assignee: Japan Science and Technology Agency, Saitama (JP)

( * ) Notice: Subject to any disclaimer, the term of this patent is extended or adjusted under 35 U.S.C. 154(b) by 129 days.

(21) Appl. No.: 14/240,219

(22) PCT Filed: Aug. 21, 2012

(86) PCT No.: PCT/JP2012/071025
§ 371 (c)(1),
(2), (4) Date: Feb. 21, 2014

(87) PCT Pub. No.: WO2013/027712
PCT Pub. Date: Feb. 28, 2013

(65) Prior Publication Data
US 2014/0166985 A1    Jun. 19, 2014

(30) Foreign Application Priority Data

Aug. 22, 2011 (JP) .................................. 2011-180767

(51) Int. Cl.
*H01L 29/06* (2006.01)
*H01L 43/06* (2006.01)
(Continued)

(52) U.S. Cl.
CPC ............. *H01L 43/065* (2013.01); *B82Y 10/00* (2013.01); *H01F 10/00* (2013.01); *H01L 27/222* (2013.01);
(Continued)

(58) Field of Classification Search
CPC .. H01L 43/065; H01L 29/775; H01L 29/861; H01L 29/205
USPC .......................................................... 257/39
See application file for complete search history.

(56) References Cited

U.S. PATENT DOCUMENTS 4,204,132 A * 5/1980 Kataoka et al. ............... 327/511
4,223,292 A * 9/1980 Morikawa et al. ......... 338/32 H
(Continued)

FOREIGN PATENT DOCUMENTS

| CN | 101026188 A | 8/2007 |
| EP | 0603711 A2 | 6/1994 |

(Continued)

OTHER PUBLICATIONS

Office Action issued in Chinese Application No. 201280039425.2, dated Jul. 1, 2014.
(Continued)

*Primary Examiner* — Phat X Cao
*Assistant Examiner* — Mohammad M Hoque
(74) *Attorney, Agent, or Firm* — Michael Best & Friedrich LLP

(57) ABSTRACT

A rectifying device includes: a one-dimensional channel (18) formed with a semiconductor, electrons traveling through the one-dimensional channel; an electrode (26) that applies an effective magnetic field generated from a spin orbit interaction to the electrons traveling through the one-dimensional channel by applying an electric field to the one-dimensional channel, the effective magnetic field being in a direction intersectional to the direction in which the electrons are traveling; and an external magnetic field generating unit (38) that generates an external magnetic field in the one-dimensional channel.

12 Claims, 10 Drawing Sheets

(51) Int. Cl.
*B82Y 10/00* (2011.01)
*H01L 29/66* (2006.01)
*H01L 29/82* (2006.01)
*H01L 27/22* (2006.01)
*H01F 10/00* (2006.01)
*H01L 43/08* (2006.01)
*H01L 43/10* (2006.01)
*H01L 29/12* (2006.01)
*H01L 29/423* (2006.01)
*H01L 29/775* (2006.01)
*H01L 29/861* (2006.01)
*H01L 29/205* (2006.01)
*H01L 29/778* (2006.01)

(52) U.S. Cl.
CPC ....... *H01L 29/125* (2013.01); *H01L 29/42356* (2013.01); *H01L 29/66984* (2013.01); *H01L 29/82* (2013.01); *H01L 43/08* (2013.01); *H01L 43/10* (2013.01); *H01L 29/0673* (2013.01); *H01L 29/205* (2013.01); *H01L 29/775* (2013.01); *H01L 29/7783* (2013.01); *H01L 29/861* (2013.01)

(56) References Cited

U.S. PATENT DOCUMENTS

| | | | | |
|---|---|---|---|---|
| 4,276,555 A | * | 6/1981 | Vinal | 257/589 |
| 4,488,164 A | * | 12/1984 | Kazarinov et al. | 257/194 |
| 5,280,181 A | * | 1/1994 | Saito et al. | 257/24 |
| 5,285,081 A | * | 2/1994 | Ando | 257/24 |
| 5,369,288 A | * | 11/1994 | Usuki | 257/26 |
| 5,418,374 A | * | 5/1995 | Morita et al. | 257/13 |
| 5,449,929 A | * | 9/1995 | Hosogi | 257/194 |
| 5,485,018 A | * | 1/1996 | Ogawa et al. | 257/24 |
| 5,497,015 A | * | 3/1996 | Ishibashi et al. | 257/287 |
| 2005/0042814 A1 | * | 2/2005 | Watanabe et al. | 438/202 |
| 2005/0184285 A1 | | 8/2005 | Friesen et al. | |
| 2005/0263751 A1 | * | 12/2005 | Hall et al. | 257/14 |
| 2007/0059877 A1 | | 3/2007 | Koo et al. | |
| 2007/0200156 A1 | | 8/2007 | Wunderlich et al. | |
| 2008/0308844 A1 | | 12/2008 | Koo et al. | |
| 2009/0059659 A1 | | 3/2009 | Inokuchi et al. | |

FOREIGN PATENT DOCUMENTS

| | | | |
|---|---|---|---|
| EP | 1764838 A2 | | 3/2007 |
| JP | 2003-092412 | * | 3/2003 |
| JP | 2003-092412 A | | 3/2003 |
| JP | 2006-032570 A | | 2/2006 |
| JP | 2006-066603 A | | 3/2006 |
| JP | 2011-071255 A | | 4/2011 |
| JP | 2011-082388 A | | 4/2011 |
| KR | 20050081125 | * | 8/2005 |
| KR | 20050081125 A | | 8/2005 |

OTHER PUBLICATIONS

Supriyo Datta and Biswajit Das, "Electronic analog of the electro-optic modulator," Applied Physics Letter 56(7), Feb. 12, 1990, pp. 665-667 (3 sheets), American Institute of Physics.

International Search Report issued in Application No. PCT/JP2012/071025, mailed Nov. 27, 2012.

Written Opinion of International Search Authority of PCT/JP 2012/071025, mailed Nov. 27, 2012.

P. Debray et al., "All-electric quantum point contact spin-polarizer," Nature Nanotechnology, vol. 4, No. 11, Sep. 6, 2009, pp. 759-764, XP055197800, ISSN: 1748-3387.

Pearton S J et al., "Spintronics device concepts-Spintronics," IEE Proceedings: Circuits Devices and Systems, Institution of Electrical Engineers, Stenvenage, GB, vol. 152, No. 4, Aug. 5, 2005, pp. 312-322.

Extended Search Report issued in European Application No. 12825398.6. dated May 26, 2015.

* cited by examiner

FIG. 4

| LAYER NAME | MATERIAL | FILM THICKNESS [nm] |
|---|---|---|
| BARRIER LAYER 16 | $In_{0.52}Al_{0.48}As$ | 25 |
| THIRD SEMI-CONDUCTOR LAYER 56 | $(In_{0.52}Al_{0.48}As)_{0.3}(In_{0.53}Ga_{0.47}As)_{0.7}$ | 3 |
| SECOND SEMI-CONDUCTOR LAYER 54 | $In_{0.8}Ga_{0.2}As$ | 5 |
| FIRST SEMI-CONDUCTOR LAYER 52 | $(In_{0.53}Ga_{0.47}As)_{0.41}(InP)_{0.59}$ | 5 |
| BARRIER LAYER 12 | $In_{0.52}Al_{0.48}As$ | 15 |
| BUFFER LAYER 50 | $n\text{-}In_{0.52}Al_{0.48}As(N_d=4\times10^{18}cm^{-3})$ | 6 |
| BUFFER LAYER 50 | $In_{0.52}Al_{0.48}As$ | 200 |
| SUBSTRATE 10 | InP | - |

RECTIFYING DEVICE, TRANSISTOR, AND RECTIFYING METHOD

TECHNICAL FIELD

The present invention relates to rectifying device, transistors, and rectifying methods, and more particularly, to a rectifying device, a transistor, and a rectifying method that use spin orbit interactions.

BACKGROUND ART

Spin electronics using spins is expected to be put into practical use. In the field of spin electronics, devices with a memory function that depends on the magnetization direction of a ferromagnetic material have been developed. Non-Patent Document 1 discloses a spin field effect transistor that uses an effective magnetic field derived from a spin orbit interaction. In the field of such spin electronics, there is a demand for spin injectors with a high spin polarization rate.

PRIOR ART DOCUMENT

Non-Patent Document

Non-Patent Document 1: Appl. Phys. Lett. 56, 665 (1990)

SUMMARY OF THE INVENTION

Problem to be Solved by the Invention

In the field of such spin electronics, there is a demand for rectifying devices in which electrons having a high spin polarization rate are obtained when electrons are made to flow in one direction, but no electrons flow in the opposite direction. Spin rectification can be performed by using such a rectifying device. The present invention aims to provide a rectifying device in which electrons having a high spin polarization rate are obtained when electrons are made to flow in one direction, but no electrons flow in the opposite direction, a rectifying method, and a transistor using the rectifying device and the rectifying method.

Means for Solving the Problem

The present invention is a rectifying device that includes: a one-dimensional channel formed with a semiconductor, electrons traveling through the one-dimensional channel; an electrode that applies an effective magnetic field generated from a spin orbit interaction to the electrons traveling through the one-dimensional channel by applying an electric field to the one-dimensional channel, the effective magnetic field being in a direction intersectional to the direction in which the electrons are traveling; and an external magnetic field generating unit that generates an external magnetic field in the one-dimensional channel. According to the present invention, a rectifying device in which electrons having a high spin polarization rate can be obtained when electrons are made to flow in one direction, but no electrons flow in the opposite direction can be provided.

In the above structure, the one-dimensional channel may be a quantum point contact.

In the above structure, the external magnetic field generating unit may generate the external magnetic field in the direction of the effective magnetic field or in the opposite direction from the direction of the effective magnetic field.

In the above structure, the one-dimensional channel may have a zinc blend crystal structure.

In the above structure, the one-dimensional channel may be formed on a (001)-plane or a (110)-plane.

In the above structure, the one-dimensional channel may be a semiconductor formed at a portion narrowed from both sides with respect to the direction in which the electrons are traveling.

The above structure may include a side gate that forms a depletion layer on either side of the one-dimensional channel at the narrowed portion.

The present invention is a transistor that includes the above described rectifying device.

The above structure may include: a source that injects electrons into the one-dimensional channel; and a drain that receives electrons from the one-dimensional channel, the electrode being a gate electrode.

The present invention is a rectifying method that includes: the step of applying an effective magnetic field generated from a spin orbit interaction to electrons traveling through a one-dimensional channel by applying an electric field to the one-dimensional channel formed with a semiconductor, the effective magnetic field being in a direction intersectional to the direction in which the electrons are traveling; and the step of generating an external magnetic field in the one-dimensional channel. According to the present invention, a rectifying method by which electrons having a high spin polarization rate are obtained when electrons are made to flow in one direction, but no electrons flow in the opposite direction can be provided.

Effects of the Invention

The present invention can provide a rectifying device in which electrons having a high spin polarization rate are obtained when electrons are made to flow in one direction, but no electrons flow in the opposite direction, a rectifying method, and a transistor that uses the rectifying device and the rectifying method.

BRIEF DESCRIPTION OF THE DRAWINGS

FIG. 4 is a diagram illustrating the semiconductor stack structure of a sample;

MODES FOR CARRYING OUT THE EMBODIMENTS

The following is a description of embodiments of the present invention, with reference to the drawings.

First Embodiment

Figure 1A:
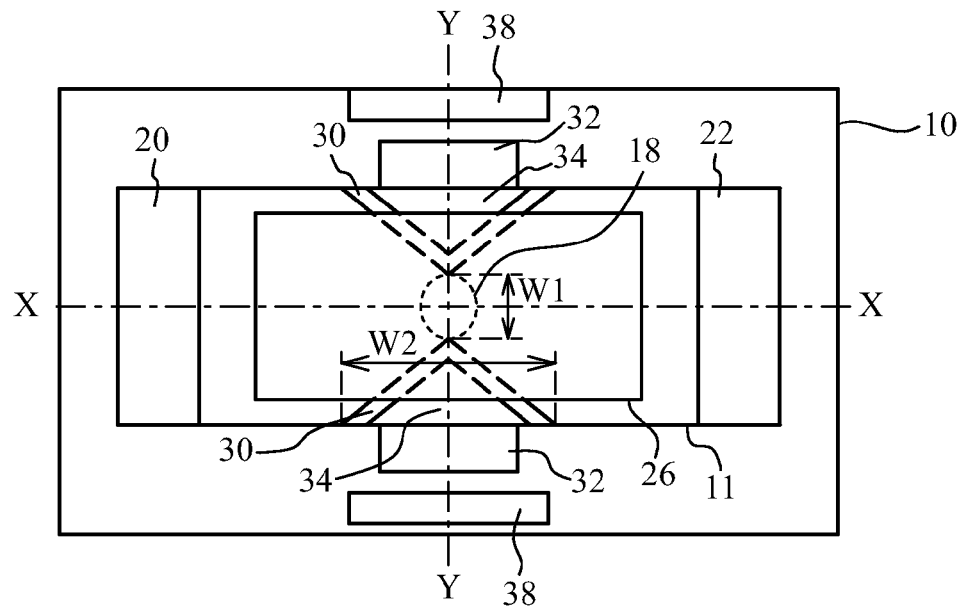
FIG. 1A is a top view of a rectifying device according to a first embodiment.
Figure 1B:
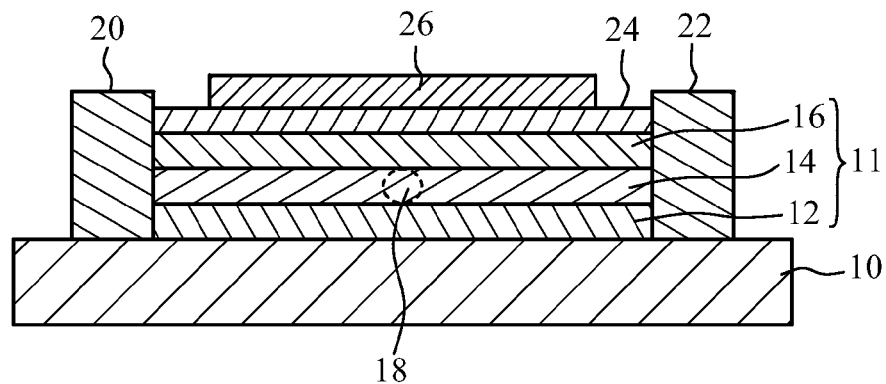
FIG. 1B is a cross-sectional view taken along the line X-X defined in FIG. 1A.
Figure 1C:
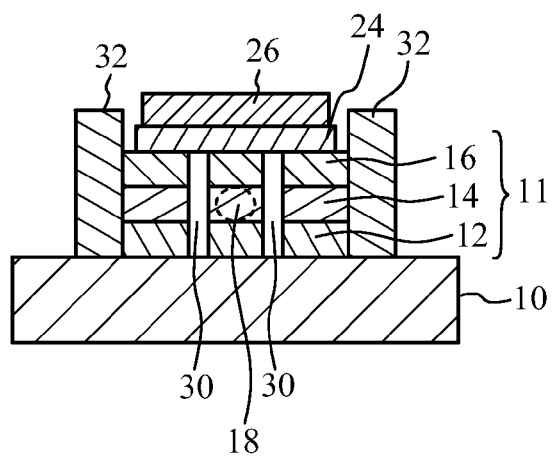
FIG. 1C is a cross-sectional view taken along the line Y-Y defined in FIG. 1A.

FIG. 1A is a top view of a rectifying device according to a first embodiment, FIG. 1B is a cross-sectional view taken along the line X-X defined in FIG. 1A, and FIG. 1C is a cross-sectional view taken along the line Y-Y defined in FIG. 1A. As shown in FIGS. 1A through 1C, a barrier layer 12, a well layer 14, and a barrier layer 16 are formed in this order as a semiconductor layer 11 on a (001)-plane semiconductor substrate 10. Grooves 30 that extend to the substrate 10 are formed in the semiconductor layer 11. The bandgap of the well layer 14 is made narrower than that of the barrier layers 12 and 16, so that electrons can be kept in the vicinity of the well layer 14. As a result, a two-dimensional channel is formed in the well layer 14. A source 20 and a drain 22 are formed so as to be in contact with the well layer 14.

The grooves each have a V-like shape extending from both side surfaces of the semiconductor layer 11 so as to form a one-dimensional channel 18 through which electrons travel from the source 20 to the drain 22. With this, a narrowed portion is formed in the semiconductor layer 11 (particularly, in the well layer 14). In this manner, the well layer 14 forms the two-dimensional channel, and the grooves 30 form the one-dimensional channel 18 with the narrowed portion. An insulating film 24 is formed on the barrier layer 16. A gate electrode 26 made of a metal is formed on the insulating film 24. The gate electrode 26 applies an electric field to the one-dimensional channel 18. Side gates 32 are in contact with regions 34 of the semiconductor layer 11 that are isolated from the channel by the grooves 30. With the side gates 32, a side gate voltage can be applied to the semiconductor layer 11 in the regions 34. Further, an external magnetic field generating unit 38 that applies an external magnetic field Bex to the one-dimensional channel 18 is provided. The external magnetic field generating unit 38 may be made of a magnetized ferromagnetic material. Alternatively, the external magnetic field generating unit 38 may generate an external magnetic field from a current.

Figure 2:
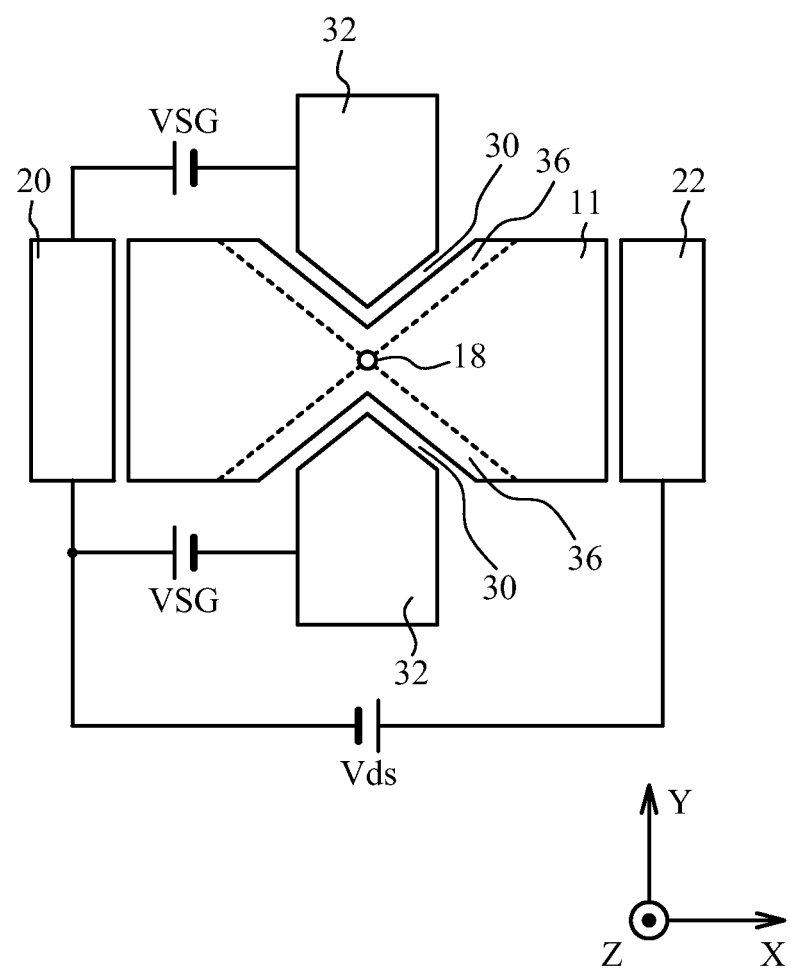
FIG. 2 is a schematic plan view of the rectifying device according to the first embodiment.

FIG. 2 is a schematic plan view of the rectifying device according to the first embodiment. FIG. 2 shows the semiconductor layer 11, the source 20, the drain 22, and the side gates 32. The direction from left to right in FIG. 2 (the direction from the source 20 toward the drain 22) is the +X-direction, the direction from bottom to top is the +Y-direction, and the direction from back to front is the +Z-direction. The side gates 32 are shown integrally with the regions 34 shown in FIG. 1A. A drain voltage Vds is applied to the drain 22 with respect to the source 20. A side gate voltage VSG is applied to the side gates 32 with respect to the source 20. When a positive drain voltage Vds is applied, electrons travel from the source 20 to the drain 22. When a negative drain voltage Vds is applied, electrons travel from the drain 22 to the source 20. At this point, the drain 22 and the source 20 actually function as a source and a drain, respectively. When a negative side gate voltage VSG is applied, depletion layers 36 are formed in the semiconductor layer 11 (particularly, in the well layer 14) in the vicinities of the grooves 30. The one-dimensional channel 18 is formed between the depletion layers 36. The width of the one-dimensional channel 18 can be adjusted depending on the amount of the side gate voltage VSG. To act as the one-dimensional channel 18, the one-dimensional channel 18 preferably has a width equal to or smaller than the Fermi wavelength, or a width of 50 to 100 nm. The one-dimensional channel 18 that has a channel width of approximately 100 nm or less and has a point-like shape of approximately 500 nm or less in the narrowed portion length in the channel direction as shown in FIG. 2 is referred to as a quantum point contact.

Figure 3A:
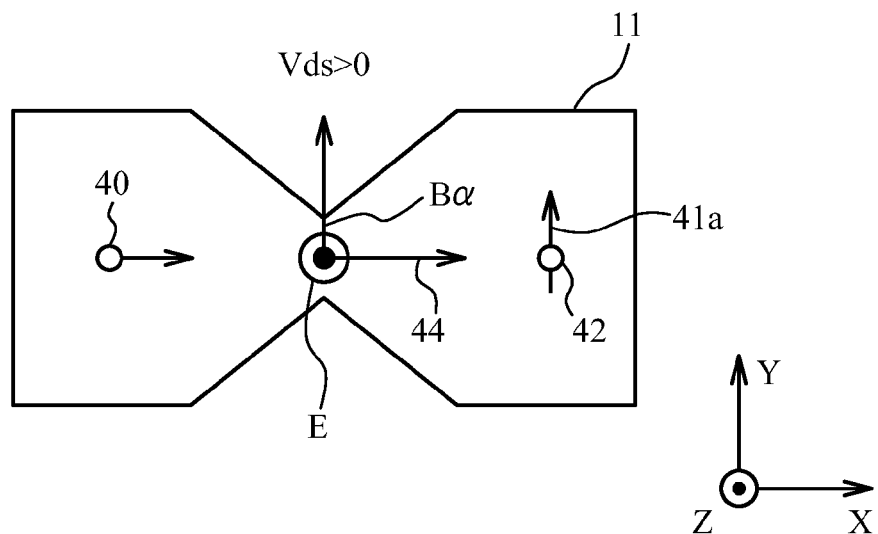
FIGS. 3A and 3B are diagrams for explaining an effective magnetic field to be applied to electrons traveling through a quantum point contact.
Figure 3B:
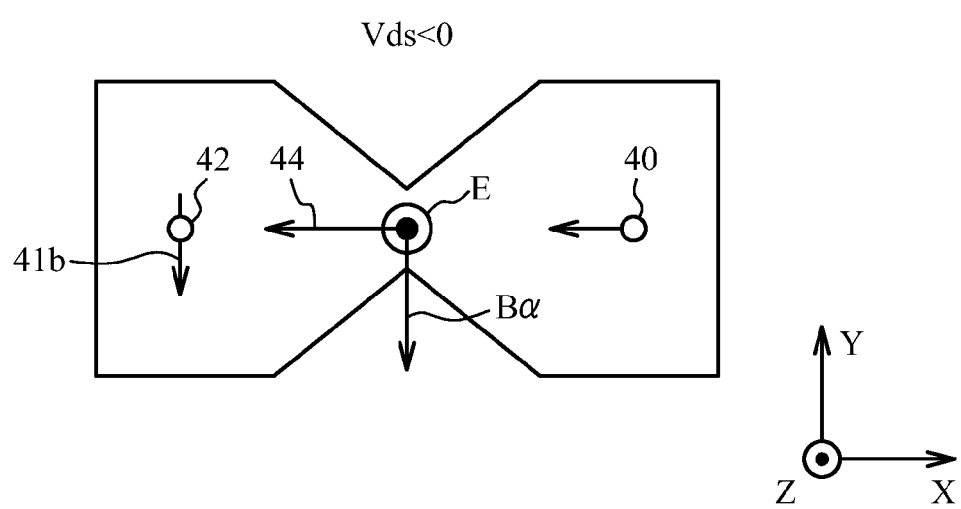

FIGS. 3A and 3B are diagrams for explaining effective magnetic fields to be applied to electrons traveling through the quantum point contact. In FIG. 3A, the drain voltage Vds is positive, and electrons 40 are traveling in the +X-direction. The gate electrode 26 applies a +Z-direction electric field E to the one-dimensional channel. In this case, an effective magnetic field $B\alpha$ in the +Y-direction is applied to the electrons 40 traveling through the one-dimensional channel 18 (as indicated by an arrow 44). In this manner, a spin orbit interaction in a semiconductor acts as an effective magnetic field on electrons. An effective magnetic field is a magnetic field that is applied to electrons when the electrons are traveling. For example, there are two types of spin orbit interactions, Rashba spin orbit interaction and Dresselhaus spin orbit interaction, in compound semiconductors having a zinc blende crystal structure. The strength $\beta$ of a Dresselhaus spin orbit interaction is determined by the direction in which electrons travel, and is constant, regardless of electric fields. The strength $\alpha$ of a Rashba spin orbit interaction varies with electric fields. The effective magnetic field $B\alpha$ in each of FIGS. 3A and 3B is generated by a Rashba spin orbit interaction. The magnitude of the effective magnetic field $B\alpha$ becomes larger, as the velocity of electrons becomes higher. The electrons 42 that have passed through the one-dimensional channel 18 are spin-polarized in the +Y-direction (as indicated by an arrow 41a) by the effective magnetic field $B\alpha$.

As electrons passing through the one-dimensional channel 18 are spin-polarized by using the effective magnetic field $B\alpha$, a higher spin polarization rate can be achieved. Normally, electrons that travel two- or three-dimensionally travel at the drift velocity due to scattering such as lattice vibration. Therefore, the effective magnetic field $B\alpha$ acting on electrons is small. Meanwhile, the mean free path of electrons traveling through the one-dimensional channel 18 as a quantum point contact is sufficiently longer than the length of the narrowed portion. In this case, electrons pass through the one-dimensional channel 18 in a ballistic manner. As a result, electrons travel through the one-dimensional channel 18 at the Fermi velocity. The Fermi velocity is 100 or more times higher than the drift velocity. Accordingly, the effective magnetic field $B\alpha$ acting on electrons can be made larger in the one-dimensional channel 18. Thus, the spin polarization rate of the electrons 42 can be increased.

In FIG. 3B, the drain voltage Vds is negative, and the electrons 40 are traveling in the −X-direction. When the electrons 40 are traveling in the −X-direction, the effective magnetic field $B\alpha$ is generated in the −Y-direction in the one-dimensional channel 18. Accordingly, the electrons 42 are spin-polarized in the −Y-direction (as indicated by an arrow 41b). The spin polarization rate of the electrons 42 can be increased as in FIG. 3A. When the voltage to be applied to the gate electrode 26 is inverted, and the electric field to be applied to the one-dimensional channel 18 is an electric field in the −Z-direction, the direction of the effective magnetic field Bα is reversed. That is, in a case where the drain voltage Vds is higher than 0, the direction of the effective magnetic field Bα is the −Y-direction, and the electrons 42 are spin-polarized in the −Y-direction. In a case where the drain voltage Vds is lower than 0, the direction of the effective magnetic field Bα is the +Y-direction, and the electrons 42 are spin-polarized in the +Y-direction.

To measure a spin polarization rate, a sample was manufactured. FIG. 4 is a diagram illustrating the semiconductor stack structure of the sample. A buffer layer 50, the barrier layer 12, a first semiconductor layer 52, a second semiconductor layer 54, a third semiconductor layer 56, and the barrier layer 16 are stacked in this order on the substrate 10. The first through third semiconductor layers 52 through 56 are equivalent to the well layer 14. The substrate 10 is a semi-insulating InP substrate, and has a (001)-plane as the principal plane. The buffer layer 50 is formed with an undoped $In_{0.52}Al_{0.48}As$ layer that has a film thickness of 200 nm, and an $In_{0.52}Al_{0.48}As$ layer that has an electron density of $4\times10^{18}$ cm$^{-3}$ and a film thickness of 6 nm. The barrier layer 12 is an undoped $In_{0.52}Al_{0.48}As$ layer having a film thickness of 15 nm. The first semiconductor layer 52 is an undoped $(In_{0.53}Ga_{0.47}As)_{0.41}(InP)_{0.59}$ layer having a film thickness of 5 nm. The second semiconductor layer 54 is an undoped $In_{0.8}Ga_{0.2}As$ layer having a film thickness of 5 nm. The third semiconductor layer 56 is an undoped $(In_{0.52}Al_{0.48}As)_{0.3}(In_{0.53}Ga_{0.47}As)_{0.7}$ layer having a film thickness of 3 nm. The barrier layer 16 is an undoped $In_{0.52}Al_{0.48}As$ layer having a film thickness of 25 nm. As $In_{0.53}Al_{0.47}As$ and $In_{0.53}Ga_{0.47}As$ are lattice-matched to InP, the layers other than the second semiconductor layer 54 are lattice-matched to InP, and the semiconductor stack structure shown in FIG. 4 is a structure with less lattice strain.

The insulating film 24 is a 150-nm thick aluminum oxide ($Al_2O_3$) film that is formed by using an atomic layer deposition device. The gate electrode 26 is formed with a Cr film having a film thickness of 10 nm and an Au film having a film thickness of 200 nm in this order from the side of the insulating film 24. The source 20 and the drain 22 are AuGeNi films with a film thickness of 200 nm. The side gates 32 are 200-nm thick AuGeNi films formed on the barrier layer 16. The grooves 30 each have a width of approximately 400 nm, and are formed so that the width W1 shown in FIG. 1A becomes 400 nm and the width W2 becomes 800 nm.

Figure 5A:
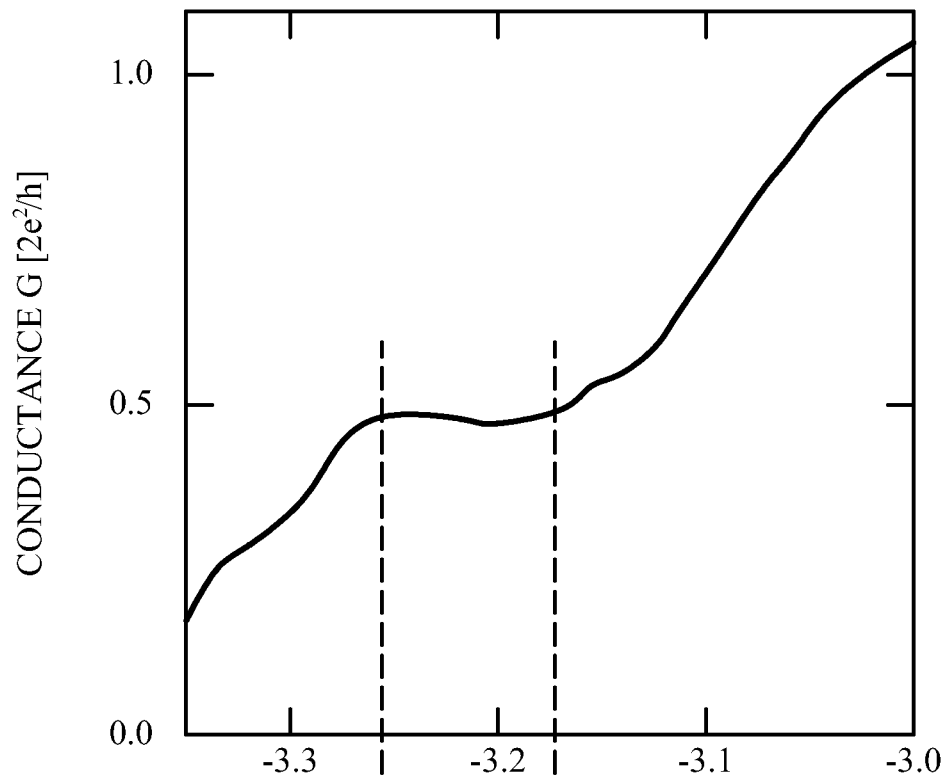
FIG. 5A is a diagram showing source-drain conductance with respect to side gate voltage.
Figure 5B:
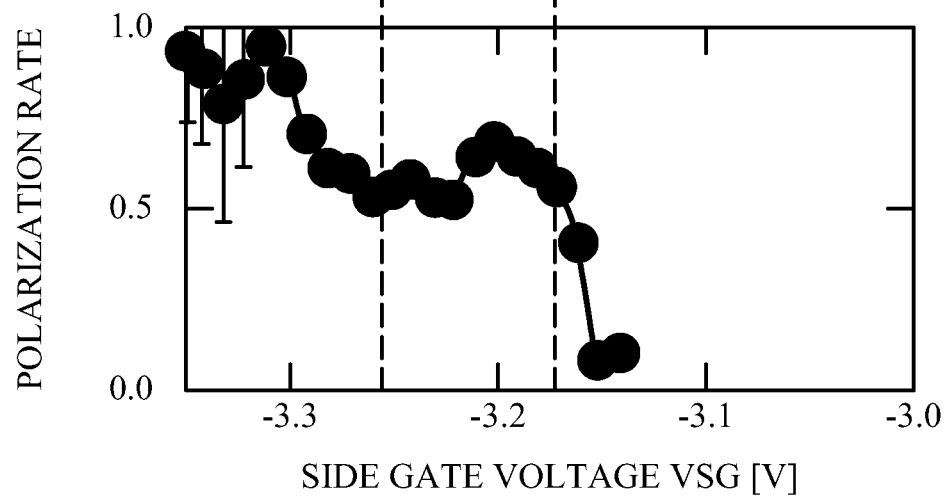
FIG. 5B is a diagram showing spin polarization rate with respect to side gate voltage.

Using the manufactured sample, spin polarization rates were measured from Fano factors. The drain voltage Vds was 10 μV, and the gate voltage was 1.7 V. The measurement temperature was 3.6 K. FIG. 5A is a diagram showing the source-drain conductance G with respect to the side gate voltage VSG, and FIG. 5B is a diagram showing the spin polarization rate with respect to the side gate voltage VSG. At the quantum point contact, electric conduction is discretized. Where the conductance G is an integral multiple of ($2e^2/h$), a step structure appears. When the conductance G is $1\times(2e^2/h)$, there exists only one electron-conductive channel at the portion of the quantum point contact. In such a situation, only up-spins or down-spins pass through the quantum point contact when an effective magnetic field acts on electrons. Therefore, the conductance G becomes $0.5\times(2e^2/h)$.

As shown in FIG. 5A, the conductance G standardized by ($2e^2/h$) is approximately 0.5 where the side gate voltage VSG is −3.26 to −3.17 V. This indicates that the quantum point contact functions as a one-dimensional channel only for up-spins or down-spins. As shown in FIG. 5B, a high spin polarization rate of 0.5 to 0.7 is achieved where the side gate voltage VSG functioning as the one-dimensional channel 18 is −3.26 to −3.17 V. As described above, electrons with a high polarization rate can be generated without the use of a ferromagnetic material.

Figure 6A:
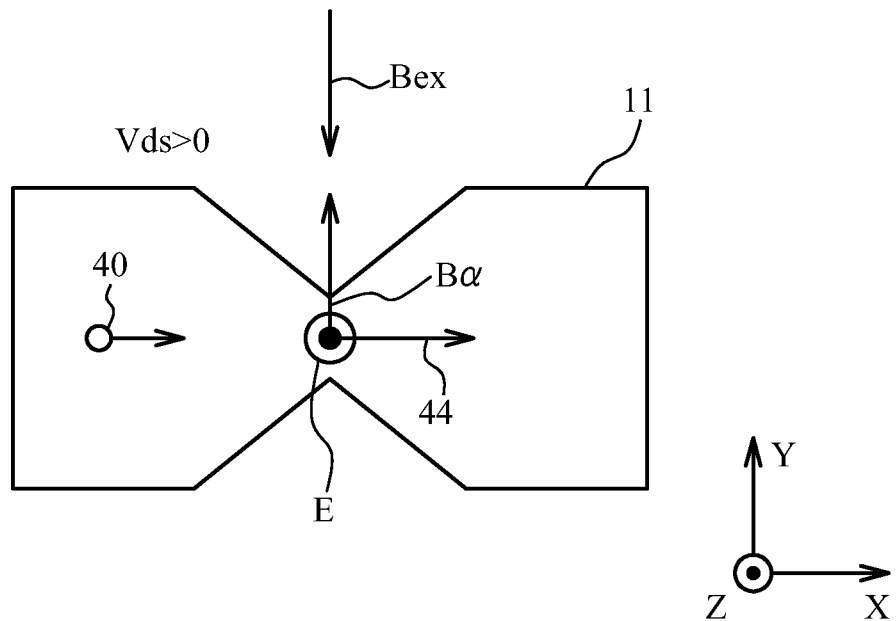
FIGS. 6A and 6B are diagrams for explaining the principles of the rectifying device according to the first embodiment.
Figure 6B:
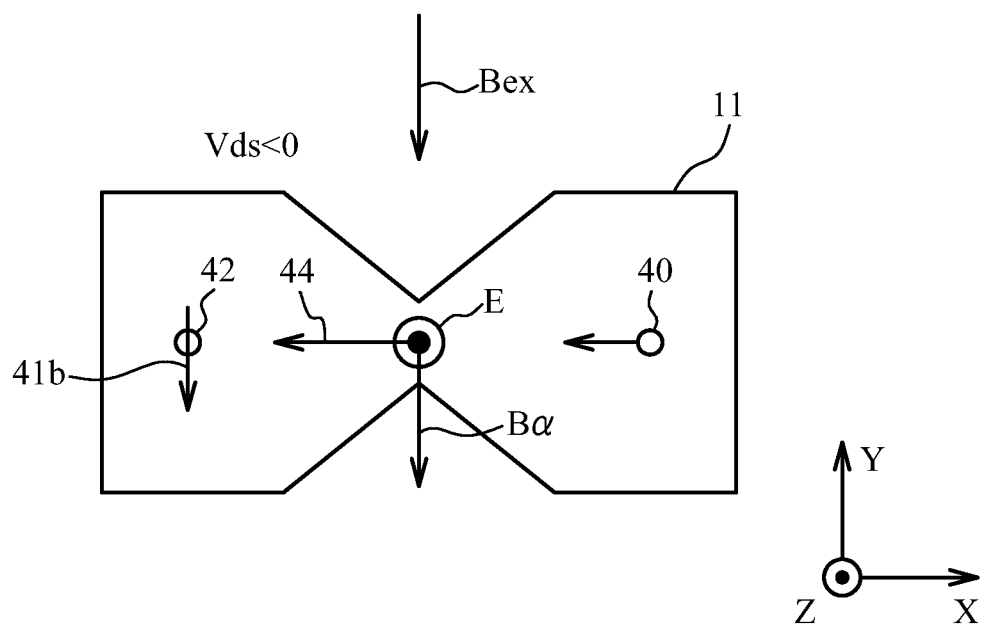
Figure 7A:
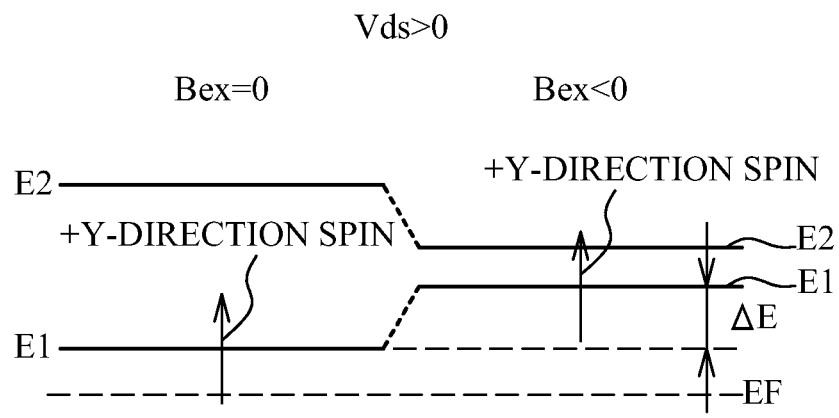
FIGS. 7A and 7B are schematic diagrams illustrating spin-split levels depending on the traveling direction of electrons.
Figure 7B:
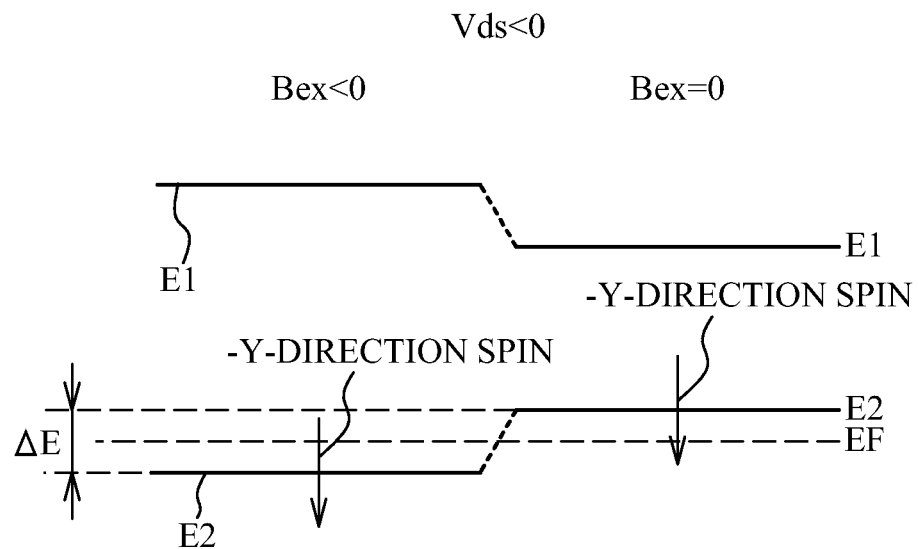

FIGS. 6A and 6B are diagrams for explaining the principles of the rectifying device according to the first embodiment. FIGS. 7A and 7B are schematic diagrams illustrating spin-split levels depending on the traveling direction of electrons. As shown in FIGS. 6A and 6B, an external magnetic field Bex is generated in the −Y-direction by the external magnetic field generating unit 38. In FIG. 6A, the drain voltage Vds is positive, and electrons are traveling in the +X-direction. In this case, the effective magnetic field Bα to be applied to the electrons 40 is in the +Y-direction. In a case where the external magnetic field Bex is 0 as in FIG. 7A, the electrons 40 have levels spin-split by the effective magnetic field Bα. In this case, a spin level E1 spin-polarized in the +Y-direction is lower than a spin level E2 spin-polarized in the −Y-direction. When the external magnetic field Bex is applied in the −Y-direction (or where Bex<0), the direction of the external magnetic field Bex is the opposite of the direction of the effective magnetic field Bα. Therefore, the spin level E1 becomes higher than that in the case where Bex=0, and the spin level E2 becomes lower than that in the case where Bex=0. The energy ΔE by which the spin level E1 higher when the external magnetic field Bex is applied is ½$g\mu_B$Bex. Here, g represents the g factor, and $\mu_B$ represents the magnetic permeability.

In FIG. 6B, the drain voltage Vds is negative, and electrons are traveling in the −X-direction. In this case, the effective magnetic field Bα to be applied to the electrons 40 is in the −Y-direction. In a case where the external magnetic field Bex is 0 as in FIG. 7B, the electrons 40 have levels spin-split by the effective magnetic field Bα. In this case, the spin level E2 spin-polarized in the −Y-direction is lower than the spin level E1 spin-polarized in the Y-direction. When the external magnetic field Bex(<0) is applied, the direction of the external magnetic field Bex is the same as the direction of the effective magnetic field Bα. Therefore, the spin level E2 becomes lower than that in the case where Bex=0, and the spin level E1 becomes higher than that in the case where Bex=0. The energy ΔE by which the spin level E2 becomes lower when the external magnetic field Bex is applied is ½$g\mu_B$Bex.

In FIG. 7A, the electrons 40 are spin-polarized in the Y-direction by the effective magnetic field Bα (see FIG. 6A). However, the energy of the spin level E1 in the +Y-direction is increased by the external magnetic field Bex. For example, the spin level E1 becomes higher than the Fermi level EF. As a result, electrons spin-polarized in the −Y-direction are hindered from traveling in the X-direction. In FIG. 7B, on the other hand, the electrons 40 are spin-polarized in the −Y-direction by the effective magnetic field Bα (see FIG. 6B). The energy of the spin level E2 in the −Y-direction is reduced by the external magnetic field Bex. For example, the spin level E2 becomes lower than the Fermi level EF. As a result, traveling of electrons in the −X-direction is facilitated. In this manner, spin ratchet states where electron flowability varies depending on electron spin directions even when the same voltage is applied can be realized. As described above, when electrons are made to flow in the −X-direction in the rectifying device of the first embodiment, electrons that are spin-polarized in the −Y-direction (as indicated by the arrow 41b in FIG. 6B) at a high spin polarization rate are obtained, but no electrons flow in the +X-direction. If the voltage to be applied to the gate electrode 26 is inverted, and the electric field in the one-dimensional channel 18 is in the −Z-direction in this rectifying device, electrons that are spin-polarized in the Y-direction at a high spin polarization rate are obtained but no electrons flow in the −X-direction when electrons are made to flow in the X-direction.

According to the first embodiment, the gate electrode 26 applies an electric field to the one-dimensional channel 18, to apply the effective magnetic field Bα generated from a spin orbit interaction to the electrons traveling through the one-dimensional channel 18, the effective magnetic field Bα being in a direction intersectional to the direction in which the electrons are traveling. The external magnetic field generating unit 38 generates the external magnetic field Bex in the one-dimensional channel 18. With this arrangement, a rectifying device in which electrons having a high spin polarization rate are obtained when electrons are made to flow in one direction, but no electrons flow in the opposite direction is achieved, as described above with reference to FIGS. 6A through 7B.

The one-dimensional channel 18 can be formed with a quantum point contact as shown in FIG. 2.

The external magnetic field Bex generated by the external magnetic field generating unit 38 is preferably not perpendicular to the effective magnetic field Bα. With this arrangement, ΔE can be made larger, and rectifying characteristics can be further improved. Particularly, the external magnetic field Bex is preferably generated in the direction of the effective magnetic field Bα as in FIG. 7B or in the opposite direction from the direction of the effective magnetic field Bα as in FIG. 7A. In this manner, ΔE shown in FIGS. 7A and 7B can be maximized, and rectifying characteristics can be further improved.

Since Rashba spin orbit interactions are utilized, the one-dimensional channel 18 preferably has a zinc blende crystal structure. Particularly, the one-dimensional channel 18 is preferably formed with a III-V compound semiconductor. For example, the one-dimensional channel 18 is preferably formed with GaAs, InAs, AlAs, GaP, InP, AlP, GaSb, InSb, AlSb, GaN, InN, or AlN. It is also possible to use mixed crystals of those materials. Alternatively, the one-dimensional channel 18 may be formed with a II-IV compound semiconductor.

In a case where the one-dimensional channel 18 has a zinc blende crystal structure, the zinc blend crystal structure is preferably formed on a (001)-plane, a (110)-plane, or a plane equivalent to those planes, so as to obtain the effective magnetic field Bα. The traveling direction of electrons in the one-dimensional channel 18 may be any of in-plane directions.

As shown in FIG. 2, the one-dimensional channel 18 is a semiconductor formed at a portion narrowed from both sides with respect to the electron-traveling direction. As the narrowed portion is formed in the semiconductor layer 11 (particularly, in the well layer 14) in this manner, a quantum point contact can be formed.

Further, the side gates 32 to form depletion layers are provided at both sides of the narrowed portion of the well layer 14. Accordingly, the one-dimensional channel 18 can be formed by the depletion layers located at the both sides of the narrowed portion as shown in FIG. 5A.

The rectifying device according to the first embodiment can be used in initializing quantum bits in quantum computing, for example. In quantum computing, electron spins are first set in one direction (this is referred to as "initializing"), and computing is then performed. In quantum computing, a quantum bit is used as one quantum bit, for example. To inject spin-polarized electrons into quantum bits, a spin injection source of approximately the same size as the quantum bits (several hundreds of nm, for example) is preferably used. In a case where spins are injected into a semiconductor by using a ferromagnetic material, for example, spin injection is not realized when the size is several hundreds of nm. In the first embodiment, on the other hand, spin injection can be performed through a one-dimensional channel of approximately 100 nm in size, and accordingly, electrons having spins in the same direction can be injected into quantum bits. Thus, this rectifying device can be used in initializing quantum bits in quantum computing, for example.

Furthermore, the rectifying device according to the first embodiment can be used in a spin field effect transistor, for example. In a spin field effect transistor, spins are injected into a semiconductor by using a ferromagnetic material. As a result, a high-quality heterojunction is formed with the ferromagnetic material and the semiconductor. Therefore, a highly-sophisticated thin-film formation technique is required. In this rectifying device, on the other hand, spin polarization can be caused by using only a semiconductor. Accordingly, this rectifying device serves as a spin polarization source that is more suitable for semiconductor devices than a device using a ferromagnetic material. Further, in this rectifying device, a spin rectifying effect is utilized, and currents having uniform spins can be generated through random energy changes. Accordingly, this rectifying device can also be used as a power-saving spin polarization source.

Second Embodiment

Figure 8A:
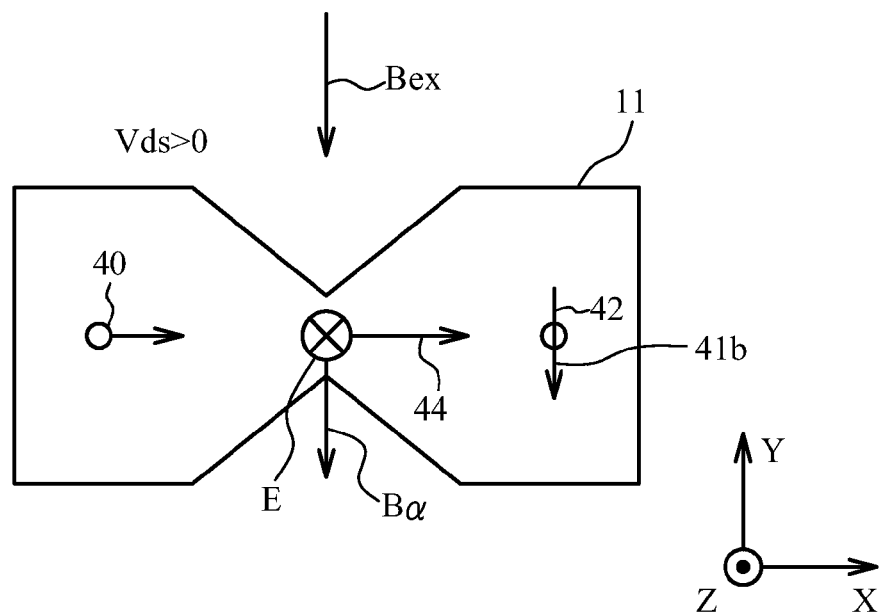
FIGS. 8A and 8B are diagrams for explaining the principles of a transistor according to a second embodiment.
Figure 8B:
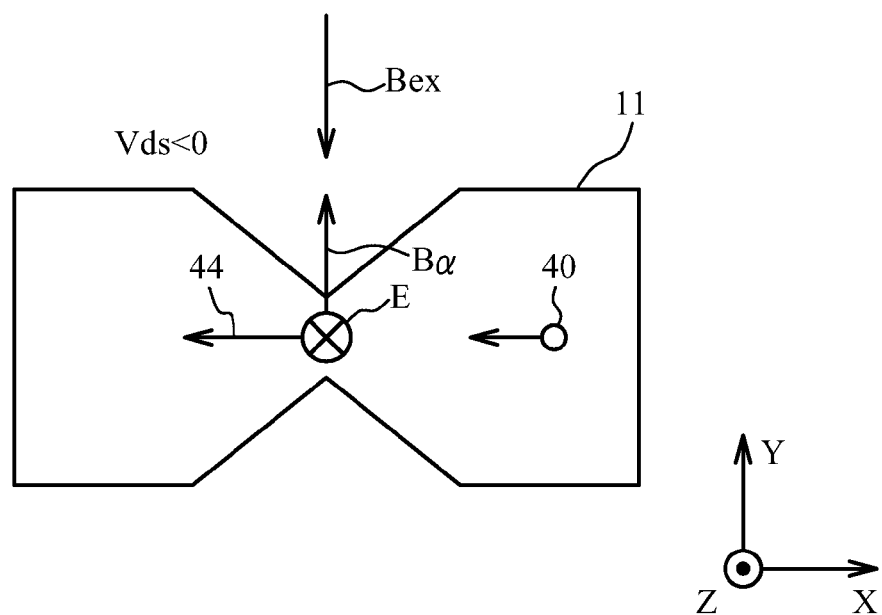
Figure 9A:
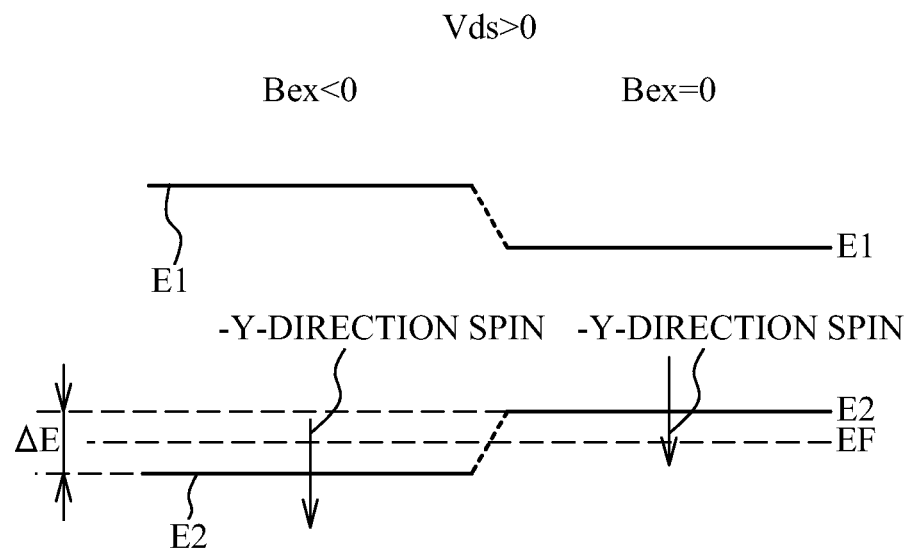
FIGS. 9A and 9B are schematic diagrams illustrating spin-split levels depending on the traveling direction of electrons.
Figure 9B:
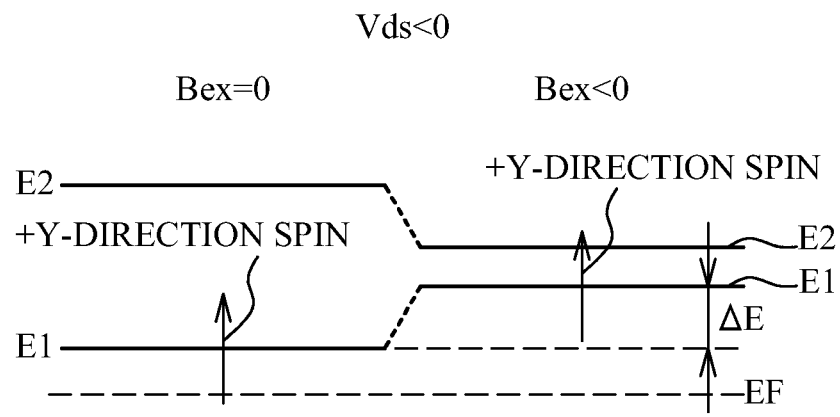

An example case where the rectifying device according to the first embodiment is used as a spin transistor is now described. FIGS. 8A and 8B are diagrams for explaining the principles of a transistor according to a second embodiment. FIGS. 9A and 9B are schematic diagrams illustrating spin-split levels depending on the traveling direction of electrons. As shown in FIGS. 8A and 8B, a −Z-direction electric field E is applied to the one-dimensional channel. An external magnetic field Bex is generated in the −Y-direction by the external magnetic field generating unit 38. In FIG. 8A, the drain voltage Vds is positive, and electrons 40 are traveling in the +X-direction. In this case, the effective magnetic field Bα to be applied to the electrons 40 is in the −Y-direction.

As shown in FIG. 9A, when the external magnetic field Bex is 0, the electrons 40 have levels spin-split by the effective magnetic field Bα. In this case, a spin level E2 spin-polarized in the −Y-direction is lower than the spin level E2 spin-polarized in the +Y-direction. When the external magnetic field Bex is applied in the −Y-direction (or where Bex<0), the direction of the external magnetic field Bex is the same as the direction of the effective magnetic field Bα. Therefore, the spin level E2 becomes lower by ΔE than that in the case where Bex=0, and the spin level E1 becomes higher than that in the case where Bex=0.

In FIG. 8B, the drain voltage Vds is negative, and electrons are traveling in the −X-direction. In this case, the effective magnetic field Bα to be applied to the electrons 40 is in the +Y-direction. In a case where the external magnetic field Bex is 0 as in FIG. 9B, the electrons 40 have levels spin-split by the effective magnetic field Bα. In this case, the spin level E1 spin-polarized in the +Y-direction is lower than the spin level E2 spin-polarized in the −Y-direction. When the external magnetic field Bex(<0) is applied, the direction of the external magnetic field Bex is the opposite of the direction of the effective magnetic field Bα. Therefore, the spin level E1 becomes higher by ΔE than that in the case where Bex=0, and the spin level E2 becomes lower than that in the case where Bex=0.

In a case where a −Z-direction electric field E is applied to the one-dimensional channel by the gate electrode 26, the energy of the −Y-direction spin level E2 becomes lower than the Fermi level EF due to the external magnetic field Bex, as shown in FIGS. 8A and 9A. As a result, traveling of electrons 42 spin-polarized in the −Y-direction (as indicated by the arrow 41b) is facilitated. In FIGS. 8B and 9B, on the other hand, the energy of the +Y-direction spin level E1 becomes higher than the Fermi level EF due to the external magnetic field Bex. As a result, electrons spin-polarized in the +Y-direction are hindered from traveling in the X-direction.

As described above, according to the second embodiment, in a case where the source 20 injects electrons into the one-dimensional channel 18 while the drain 22 receives electrons from the one-dimensional channel 18 (or where Vds>0), electrons with −Y-direction spins are restrained from traveling from the source 20 to the drain 22 when a negative voltage is applied to the gate electrode 26, as shown in FIGS. 6A and 7A. When a positive voltage is applied to the gate electrode, on the other hand, the electrons 42 spin-polarized in the −Y-direction (as indicated by the arrow 41b) travel from the source 20 to the drain 22, as shown in FIGS. 8A and 9A. In this manner, a transistor that switches on and off the flowing of electrons spin-polarized in the −Y-direction by using a gate voltage can be realized.

Third Embodiment

Figure 10A:
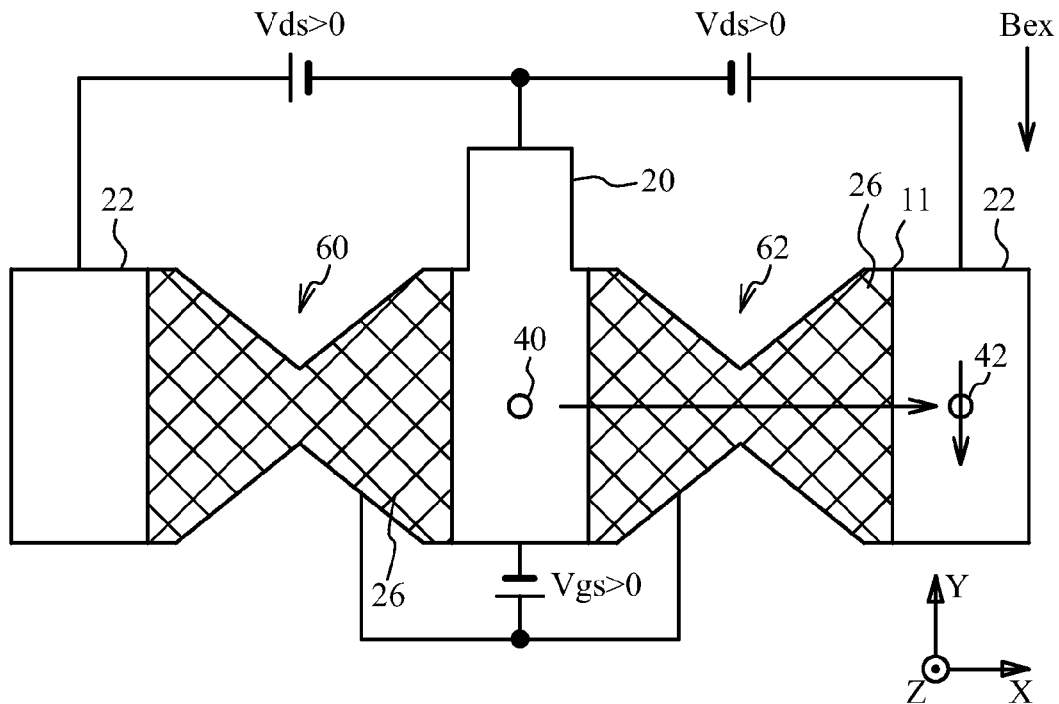
FIGS. 10A and 10B are schematic plan views for explaining operations of a third embodiment.
Figure 10B:
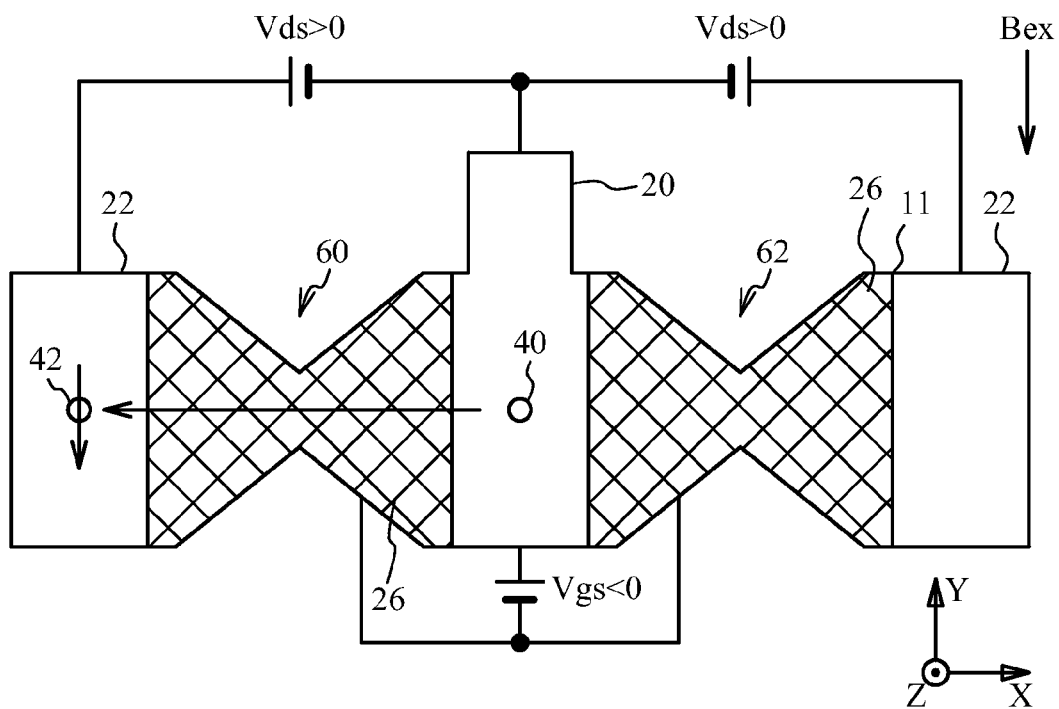

An example case where two transistors of the second embodiment are used is now described. FIGS. 10A and 10B are schematic plan views for explaining operations of a third embodiment. The shaded portions in FIGS. 10A and 10B indicate that gate electrodes 26 are formed on semiconductor layers 11. As shown in FIGS. 10A and 10B, transistors 60 and 62 according to the second embodiment are connected. The two transistors 60 and 62 share one source 20.

As shown in FIG. 10A, a positive drain voltage Vds is applied between the source 20 and the drains 22. As a result, electrons are about to move in the −X-direction in the transistor 60, and in the X-direction in the transistor 62. A positive voltage Vgs is applied to the gate electrodes 26. In a case where an external magnetic field Bex is applied in the −Y-direction, electrons 40 do not flow in the −X-direction in the transistor 60, as described above with reference to FIGS. 8A and 8B. In the transistor 62, on the other hand, electrons spin-polarized in the −Y-direction flow in the X-direction. As a result, the transistor 60 is put into a shut-down state. The transistor 62 is in a conduction state, and spin-polarized electrons flow from the source 20 to the drain 22.

In FIG. 10B, a positive drain voltage Vds is applied between the source 20 and the drains 22, and a negative voltage Vgs is applied to the gate electrodes 26. In a case where the external magnetic field Bex is applied in the −Y-direction, electrons spin-polarized in the −Y-direction flow in the −X-direction in the transistor 60, as described above with reference to FIGS. 6A and 6B. In the transistor 62, on the other hand, the electrons 40 do not flow in the X-direction. As a result, the transistor 62 is put into a shut-down state. The transistor 60 is put into a conduction state, and spin-polarized electrons flow from the source 20 to the drain 22.

According to the third embodiment, a one-input two-output switch circuit can be readily realized by using transistors according to the second embodiment. In cases other than the third embodiment, various electronic circuits can be realized by using rectifying devices of the first embodiment.

Although an example of a transistor and an example of transistors using the first embodiment have been described above, each of those transistors may have some other structure, as long as it includes a rectifying device according to the first embodiment. A rectifying device of the first embodiment can also be used in a magnetic sensor or the like. Furthermore, the first through third embodiments can be used as electronic components for household electric appliances and communication devices such as monitors and television sets, and electronic apparatuses such as computers.

Although preferred embodiments of the invention have been described in detail so far, the present invention is not limited to those particular embodiments, and various changes and modifications may be made to them within the scope of the invention claimed herein.

DESCRIPTION OF REFERENCE NUMERALS 11 semiconductor layer
18 one-dimensional channel
20 source
22 drain
26 gate electrode
32 side gate
38 external magnetic field generating unit
60, 62 transistors

The invention claimed is:
1. A rectifier comprising:
a one-dimensional channel formed with a semiconductor, electrons traveling through the one-dimensional channel;
a source that injects the electrons into the one-dimensional channel and does not include a ferromagnetic material;
a drain that receives the electrons from the one-dimensional channel and does not include a ferromagnetic material;
an electrode that is provided above the one-dimensional channel and applies an effective magnetic field generated from a spin orbit interaction to the electrons traveling through the one-dimensional channel by applying an electric field to the one-dimensional channel so that a direction of the effective magnetic field generated to electrons traveling in a first direction of the one-dimensional channel is opposite to a direction of the effective magnetic field generated to electrons traveling in a second direction opposite the first direction, the effective magnetic field being in a third direction intersectional to the first direction and the second direction in which the electrons are traveling; and
an external magnetic field generating unit that is provided at a side of the one-dimensional channel with respect to the first direction and the second direction and generates an external magnetic field in the one-dimensional channel so that an amount of an electron flow in the first direction is different from that in the second direction.

2. The rectifier according to claim 1, wherein the one-dimensional channel is a quantum point contact.

3. The rectifier according to claim 1, wherein the external magnetic field generating unit generates the external magnetic field in the third direction of the effective magnetic field or in the opposite direction from the third direction of the effective magnetic field.

4. The rectifier according to claim 1, wherein the one-dimensional channel has a zinc blend crystal structure.

5. The rectifier according to claim 4, wherein the one-dimensional channel is formed on one of a (001)-plane and a (110)-plane.

6. The rectifier according to claim 1, wherein the one-dimensional channel is a semiconductor formed at a portion narrowed from both sides with respect to the first direction and the second direction in which the electrons are traveling.

7. The rectifier according to claim 6, further comprising a side gate configured to form a depletion layer on either side of the one-dimensional channel at the narrowed portion.

8. A transistor comprising a rectifier of claim 1.

9. The transistor according to claim 8, wherein the electrode is a gate electrode.

10. A rectification method comprising:
applying an effective magnetic field generated from a spin orbit interaction to electrons traveling through a one-dimensional channel by applying an electric field to the one-dimensional channel formed with a semiconductor so that a direction of the effective magnetic field generated to electrons traveling in a first direction of the one-dimensional channel is opposite to a direction of the effective magnetic field generated to electrons traveling in a second direction opposite the first direction, the effective magnetic field being in a third direction intersectional to the first direction and the second direction in which the electrons are traveling; and
generating an external magnetic field in the one-dimensional channel so that an amount of an electron flow in the first direction is different from that in the second direction.

11. A rectification method for the rectifier according to claim 1, comprising:
applying the effective magnetic field to the one-dimensional channel so that a direction of the effective magnetic field generated to electrons traveling in the first direction of the one-dimensional channel is opposite to a direction of the effective magnetic field generated to electrons traveling in the second direction opposite the first direction, the effective magnetic field being in the third direction; and
generating the external magnetic field in the one-dimensional channel so that an amount of an electron flow in the first direction is different from that in the second direction.

12. The rectifier according to claim 3, wherein the amount of the electron flow when the external magnetic field in the third direction of the effective magnetic field is generated is greater than that when the external magnetic field in the opposite direction from the third direction of the effective magnetic field is generated.

* * * * *